United States Patent
Xia et al.

(10) Patent No.: US 7,195,679 B2
(45) Date of Patent: Mar. 27, 2007

(54) VERSATILE SYSTEM FOR WAFER EDGE REMEDIATION

(75) Inventors: Changfeng Xia, Plano, TX (US); Trace Q. Hurd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 592 days.

(21) Appl. No.: 10/601,016

(22) Filed: Jun. 21, 2003

(65) Prior Publication Data

US 2004/0255985 A1    Dec. 23, 2004

(51) Int. Cl.
*B08B 3/02*    (2006.01)
(52) U.S. Cl. .......... 134/33; 134/153; 134/813; 134/902; 134/147
(58) Field of Classification Search .......... 134/147, 134/153, 902, 183, 33
See application file for complete search history.

(56) References Cited

U.S. PATENT DOCUMENTS

| | | | | |
|---|---|---|---|---|
| 4,465,549 A | * | 8/1984 | Ritzman | 438/75 |
| 4,821,675 A | * | 4/1989 | Ikeno et al. | 118/667 |
| 4,899,686 A | * | 2/1990 | Toshima et al. | 118/50 |
| 5,159,374 A | * | 10/1992 | Groshong | 396/609 |
| 5,271,796 A | * | 12/1993 | Miyashita et al. | 438/16 |
| 5,660,634 A | * | 8/1997 | Fujiyama et al. | 118/319 |
| 5,952,045 A | * | 9/1999 | Bossart | 438/758 |
| 6,004,631 A | * | 12/1999 | Mori | 427/534 |
| 6,012,858 A | * | 1/2000 | Konishi et al. | 396/611 |
| 6,165,552 A | * | 12/2000 | Anai et al. | 427/240 |
| 6,261,635 B1 | * | 7/2001 | Shirley | 427/240 |
| 6,615,854 B1 | * | 9/2003 | Hongo et al. | 134/148 |
| 6,872,254 B2 | * | 3/2005 | Shirley | 118/52 |
| 7,007,702 B2 | * | 3/2006 | Langen | 134/99.1 |
| 2004/0137745 A1 | * | 7/2004 | Houghton et al. | 438/706 |

FOREIGN PATENT DOCUMENTS

| | | | |
|---|---|---|---|
| JP | 9-177768 | * | 1/1997 |
| JP | 2003-45845 | * | 2/2003 |

\* cited by examiner

*Primary Examiner*—Frankie L. Stinson
(74) *Attorney, Agent, or Firm*—Peter K. McLarty; W. James Brady, III; Frederick J. Telecky, Jr.

(57) ABSTRACT

The present invention provides a system (200, 300) for remediating aberrations along the perimeter of a semiconductor wafer (202). The system includes a cleaning apparatus (204) within which the wafer is spun within a confined area. A chuck (208) defines the confined area, having a sidewall that extends above the upper surface (214) of the wafer and surrounds the perimeter of the wafer. The chuck also has a bottom wall, with an aperture formed therein, beneath the wafer. The system includes an isolation barrier (220), disposed atop the bottom wall of the chuck and around the aperture, in proximity to the lower surface so of the wafer. This forms a narrow gap (226) between the barrier and the wafer. A pressurized source forcefully directs a gas (218) at and along the lower surface of the wafer. The system also includes a remediation solution (228) that is applied to the upper surface of the wafer. The solution is forced into a well (230) formed between the chuck sidewall and the perimeter of the wafer, such that the solution bathes the perimeter of the wafer.

29 Claims, 2 Drawing Sheets

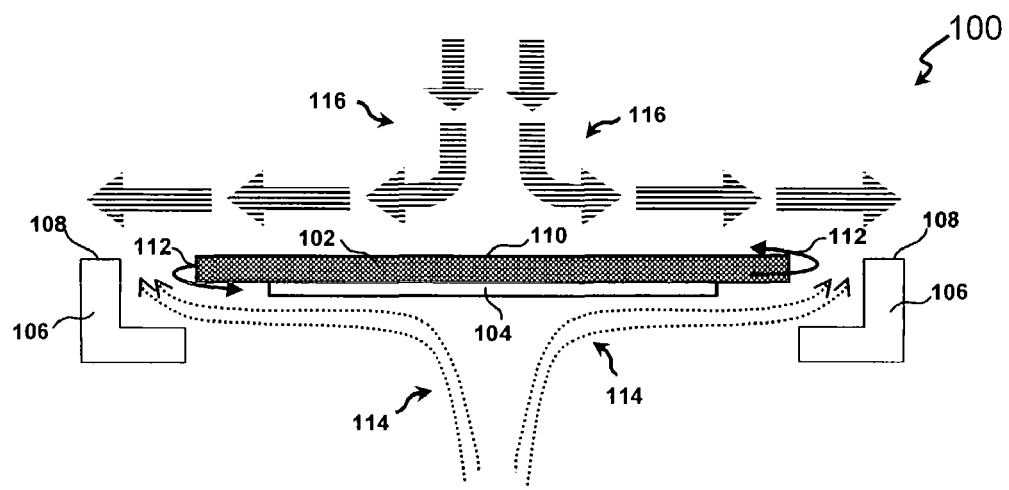
Fig. 1 (*Prior Art*)
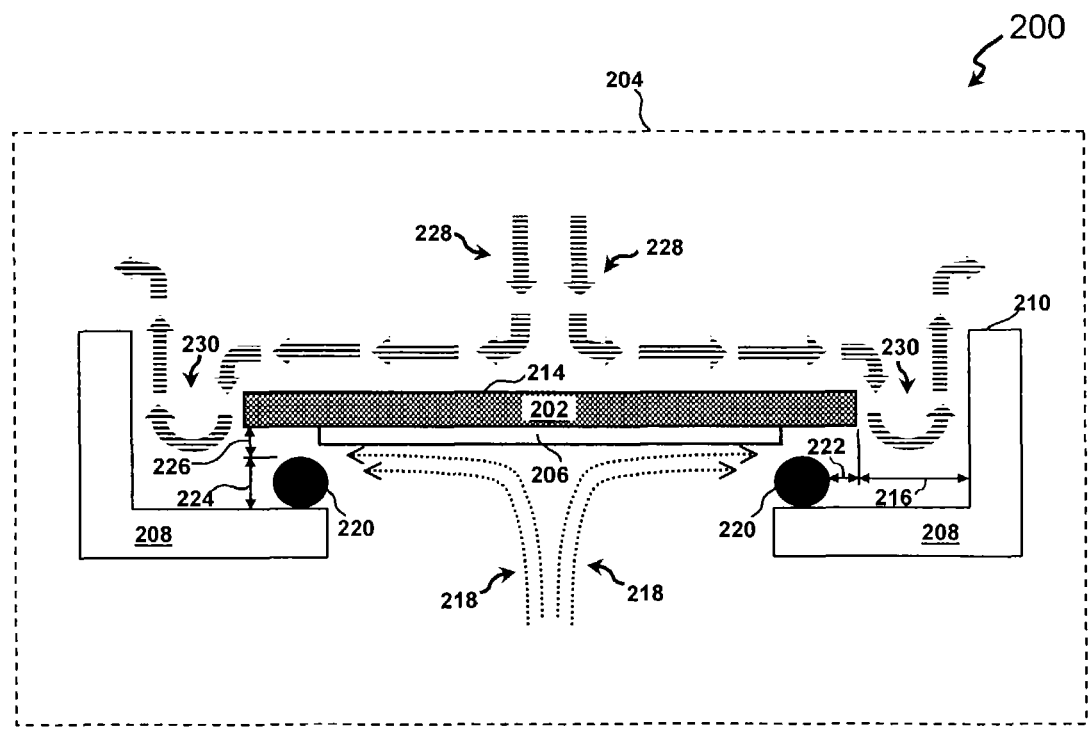
Fig. 2

VERSATILE SYSTEM FOR WAFER EDGE REMEDIATION

TECHNICAL FIELD OF THE INVENTION

The present invention relates generally to the field of semiconductor devices and, more particularly, to apparatus and methods for remediating aberrations around the outer edge or perimeter of a substrate during device fabrication.

BACKGROUND OF THE INVENTION

The continual demand for enhanced integrated circuit performance has resulted in, among other things, a dramatic reduction of semiconductor device geometries, and continual efforts to optimize the production and performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of—and attention to—maximum utilization and yield of wafer real estate.

The increased packing density of the integrated circuit generates numerous challenges to the semiconductor manufacturing process. Modern semiconductor fabrication processes involve numerous processing steps, during which numerous material layers are deposited on a substrate (or wafer). Multiple levels of metal and dielectric are commonly deposited in such processes and, often, new materials or compositions are introduced. The deposition of multiple layers requires repetitive processing steps—and repetitive stresses—to the material layers disposed upon the wafer. The differing physical properties (e.g., coefficient of thermal expansion) of the varied material layers, when subjected to the repetitive stresses of the fabrication process, can cause a number of physical aberrations in the wafer structure.

Even the most minor physical aberrations in the structural integrity of one portion of a wafer can cause significant, and even catastrophic, damage to the entire wafer. Consider, for example, the problems associated with wafer edge aberrations. Often, such aberrations take the form of peeling or blistering of structures along the outer edge of the wafer. On a given wafer (or substrate), active device area may be fabricated to consume nearly the entire surface area of one side of the wafer. Buffer area or margin between the perimeter of the active area and the outer edge of the wafer may be nominal or nearly non-existent. Peeling or blistering of edge structures can directly damage the structure of devices fabricated near the outer perimeter of the wafer. More commonly, however, peeling and blistering of edge structures results in a chaff of small, broken pieces of material and debris that can scatter across the wafer surface and throughout the downstream processes. The propagation of this debris can cause direct damage (e.g., tears and pits) to device structures throughout the wafer. The propagation of this debris can further cause indirect damage to device structures by blocking later etch and deposition processes.

Regardless of the mode of damage done, such edge aberrations have, in the past, usually resulted in a significant yield loss, as wafers exhibiting such aberrations were scrapped completely. It appears that there have previously been no successful systems for remediating such aberrations. Once such aberrations were apparent, a wafer would be scrapped completely so as to prevent debris from contaminating the process flow for later wafers. Where each wafer contained hundreds, if not thousands, of individual devices, a significant and costly yield loss resulted.

As a result, there is a need for a wafer edge remediation system providing efficient and thorough remediation of aberrations and improving overall production yields.

SUMMARY OF THE INVENTION

The present invention provides a versatile system for wafer edge remediation, providing thorough remediation of aberrations and improving production yields, in an easy, efficient and cost-effective manner. Specifically, the present invention provides a system that safely remediates peeling, blistering and other structural anomalies occurring along the outer perimeter of a semiconductor wafer—particularly along its edge—without significantly affecting active area on the wafer. The present invention provides apparatus, methods, and chemistries, readily adaptable to semiconductor manufacturing processes, that safely bathe the outer perimeter of a wafer with a solution that strips away undesired aberrations and to debris—salvaging a wafer that might have otherwise been scrapped. The present invention provides a backside cleaning process that employs a specialized chuck, an isolation barrier, and solutions for dissolving desired materials. The present invention thus efficiently reclaims wafers having edge—aberrations resulting in higher yields and fewer reliability problems when compared to previous methods.

More specifically, the present invention provides a system for remediating aberrations along an outer perimeter of a substrate. The system includes a cleaning apparatus within which the substrate is spun within a confined area. A chuck defines the confined area, having a sidewall that extends above an upper surface of the substrate and surrounds the outer perimeter of the substrate. The chuck also has a bottom wall, with an aperture formed therein, beneath the substrate. The system includes an isolation barrier, disposed atop the bottom wall of the chuck and around the aperture, in proximity to a lower surface of the substrate. This forms a narrow gap between the barrier and the substrate. A pressurized source forcefully directs a gas at and along the lower surface of the substrate. The system also includes a remediation solution that is applied to the upper surface of the substrate. The solution is forced into a well formed between the chuck sidewall and the outer perimeter of the substrate, such that the solution bathes the outer perimeter of the substrate.

The present invention also provides a wafer edge remediation assembly that includes a cleaning apparatus, adapted to spin a wafer within a confined area. A chuck defines the confined area, having a sidewall adapted to extend above an upper surface of the wafer and surround an outer perimeter of the wafer in a spaced apart relationship, also having a bottom wall with an aperture formed therein. An isolation barrier is included, disposed atop the bottom wall of the chuck, around the aperture, and adapted to be disposed in proximal relationship to a lower surface of the wafer. The assembly also includes: a pressurized source adapted to forcefully direct a gas through the aperture, at and along the lower surface of the wafer; and a remediation solution source.

The present invention additionally provides a chuck for use in remediation of aberrations along a wafer perimeter. The chuck comprises a sidewall, adapted to extend above the wafer perimeter and to surround the wafer perimeter in a spaced apart relationship, forming a circumferential well therebetween. The chuck further comprises a bottom wall with an aperture formed therein. An isolation barrier is provided, disposed atop: the bottom wall of the chuck, around the aperture.

The present invention further provides a method of remediating aberrations along a perimeter of a wafer. A wafer having aberrations along its outer perimeter is placed within a cleaning apparatus adapted to spin the wafer within a confined area. A chuck, defining the confined area, has a sidewall extending above an upper surface of the wafer and surrounding the perimeter of the wafer in a spaced apart relationship, forming a circumferential well therebetween. The chuck also has a bottom wall, with an aperture formed therein, beneath a lower surface of the wafer. An isolation barrier is disposed atop the bottom wall of the chuck, around the aperture, and in proximal relationship to the lower surface of the wafer. This forms a narrow gap between an upper surface of the barrier and the lower surface of the wafer. A pressurized source forcefully directs a gas at and along the lower surface of the wafer. A remediation solution is applied to the upper surface of the wafer. The solution is forced into the circumferential well such that the solution bathes the outer perimeter of the wafer.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which:

FIG. 1 is an illustration of a PRIOR ART backside cleaning system;

FIG. 2 is an illustration of one embodiment of an edge remediation system according to the present invention.

DETAILED DESCRIPTION OF THE INVENTION

Figure 3:
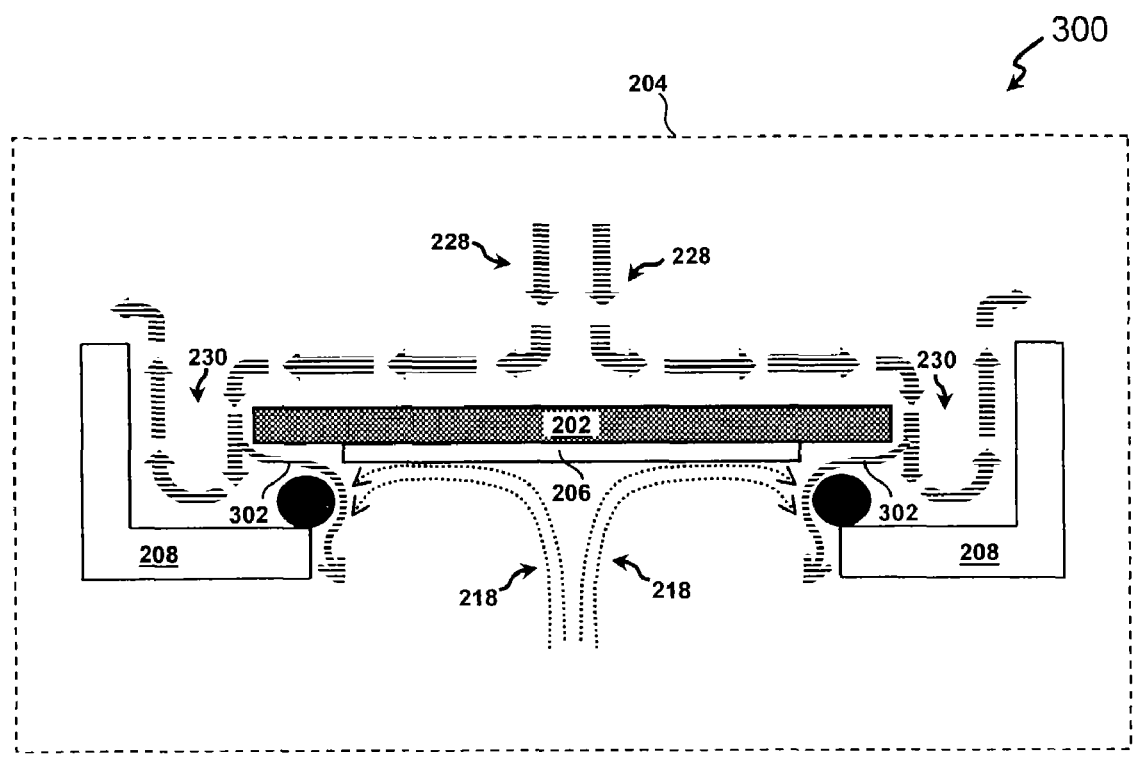
FIG. 3 is an illustration of another embodiment of an edge remediation system according to the present invention.

While the making and using of various embodiments of the present invention are discussed in detail below, it should be appreciated that the present invention provides many applicable inventive concepts, which can be embodied in a wide variety of specific contexts. The invention will now be described in conjunction with remediating edge aberrations from a semiconductor wafer. The specific embodiments discussed herein are merely illustrative of specific ways to make and use the invention and do not limit the scope of the invention.

The present invention provides a versatile system for remediating aberrations along the outer perimeter of a semiconductor wafer, particularly along the edge. Specifically, the present invention defines a system that safely remediates peeling, blistering and other structural anomalies occurring along a wafer's edge without significantly affecting active area on the wafer. The present invention recognizes that edge aberrations often occur in the upper metal and dielectric layers, closest to the front side of the wafer and its active area. The present invention further recognizes that remediation of edge aberrations should, optimally, not affect active device area on the wafer. The present invention also recognizes, however, that effective remediation—salvaging any portion of a wafer—provides significant yield improvements when compared to completely scrapping the wafer.

The present invention provides apparatus, methods, and chemistries, readily adaptable to semiconductor manufacturing processes. The present invention recognizes that a remediation process should integrate with existing production equipment and processes with as little impact to process flow and costs as possible.

More specifically, the present invention provides a backside cleaning process that employs a specialized chuck, used in conjunction with an isolation barrier and particular solutions, as described in greater detail hereafter. For purposes of explanation and illustration, however, it is helpful to first understand certain aspects of conventional backside cleaning processes.

Therefore, referring now to prior art FIG. 1, a conventional backside cleaning process 100 is illustrated. A conventional backside cleaning process is used to clean or polish the "back side" of a wafer—the side opposite the active device area side. Process 100 is illustrated in a cross-sectional view of a wafer 102 within a backside cleaning apparatus (not shown). Wafer 102 has, on its lower surface, active device area 104. Within the cleaning apparatus, wafer 102 is disposed within a chuck 106. The cleaning apparatus is adapted to spin wafer 102 in fixed relation to, and within a confined area defined by, chuck 106. Chuck 106 circumferentially surrounds wafer 102, and the upper edge 108 of chuck 106 is positioned just slightly below the level corresponding to the desired finished backside surface 110 of wafer 102. Within the cleaning apparatus, wafer 102 spins 112 while a pressurized source (not shown) forces an inert gas 114 (e.g., $N_2$) up through an aperture formed in the bottom wall of chuck 106, along the surface of active area 104, and out and around the outer edges of wafer 102. A cleaning solution 116 is then applied near the center of backside 110, from a source (not shown) within the cleaning apparatus. Cleaning solution may be applied from the source with or without pressurization. The spinning 112, in combination with forced gas 114 rising up through the gap between wafer 102 and chuck 106, causes solution 116, as it contacts backside 110, to be ejected laterally off and out from the perimeter of surface 110. Solution 116 thus cleans or polishes only surface 110, without affecting the outer edges of wafer 102 or active area 104.

In contrast, the present invention is now described with reference to FIG. 2. In FIG. 2, a wafer edge remediation system 200 according to the present invention is illustrated. System 200 of present invention is depicted vis-a-vis a cross-sectional view of a wafer 202, within a cleaning apparatus 204 according to the present invention. Wafer 202 has, on its lower surface, active device area 206. Wafer 202 has, along its outer edge and perimeter, a variety of aberrations (not shown) throughout both metal and dielectric layers.

Within cleaning apparatus 204, wafer 202 is disposed within a chuck 208. Apparatus 204 is adapted to spin wafer 202 in fixed relation to, and within a confined area defined by, chuck 208. Chuck 208 circumferentially surrounds wafer 202, and the upper edge 210 of chuck 208 is formed or positioned above the level corresponding to backside surface 214 of wafer 202, at a height sufficient to effect the process of the present invention as described hereinafter. Chuck 208 is formed or positioned such that its inner sidewall circumferentially surrounds and is spaced apart from the outer edge of wafer 202 at a certain distance 216. Distance 216 is selected or formed to effect the process of the present invention as described hereinafter.

Wafer 202 spins—in a manner similar to wafer 102 of system 100—while a pressurized source (e.g., an air or gas) jet forces gas 218 through an aperture formed in the bottom wall of chuck 208 toward and along the surface of active area 206. An isolation barrier 220 is circumferentially disposed atop the lower inside surface of chuck 208, in proximity to active area 206 of wafer 202. The diameter of barrier 220 can be varied to alter the relative distance 222 between the outer edges of barrier 220 and wafer 202. Similarly, the relative height 224 of barrier 220 can be varied to provide a gap, between the upper edge of barrier 220 and the lower surface of wafer 202 or area 206, of a desired distance 226. As gas 218 is forced along the surface of active area 206, it flows through this gap, effecting the process of the present invention as described hereinafter. Distance 226 is optimized to allow sufficient flow of gas 218 while isolating a desire portion of wafer 202, particularly active area 206, from any backflow through the gap. In fact, distances 222 and 226 can be altered, by providing or forming a barrier 220 of differing diameter or height, to effect selective exposure, of wafer 202 to the cleaning process of the present invention. Thus, not only can the backside and outer edge of wafer 202 be cleaned, but selectable portions of the "front" side of wafer 202—around or including active area 206—may also be cleaned in accordance with the processes described hereinafter. Accordingly, aberrations in any layer or level, including front and back surfaces, around the perimeter of a wafer may be remediated by the present invention. For example, a barrier 220 having a relatively large height 224, such that distance 226 is nominal, and a relatively small diameter, such that distance 222 is significant, may be employed to provide cleaning or stripping of the entire perimeter of wafer 202, including the outer perimeter of active area 206.

Barrier 220 is formed or composed of any suitable material that provides reliable isolation from the solutions of the present invention described hereinafter. Furthermore, although depicted in FIG. 2 as having a circular cross-sectional profile, barrier 220 may comprise other cross-sectional profiles of suitable geometry. In one embodiment, for example, barrier 220 may comprise a semi-rigid polymer O-ring. In an alternative embodiment, barrier 220 may comprise a rigid ceramic flange. Other alternative embodiments in accordance with the present invention are comprehended thereby.

According to one embodiment of the present invention, a cleaning solution 228 is applied near the center of backside 214, from a source (not shown) within apparatus 204. Solution 228 may be applied from the source with or without pressurization. The spinning of wafer 202 propels solution 228 outward along surface 214. The sidewalls of chuck 208 restrict the flow of solution 228, forcing it into well 230 formed by the inner sidewalls of chuck 208 and the outer edge of wafer 202. The dimension 216 of well 230, the spinning of wafer 202, and the flow of gas 218 over barrier 220 combine to produce a quasi-static bath of solution 228 within well 230. Depending on the flow rate and viscosity of solution 228, the spin rate of wafer 202, the flow rate of gas 218, and dimensions 216, 222 and 226, the solution bath within well 230 may be varied from a nearly static state to a turbulent or churning state—effecting a more drastic and rapid cleaning or stripping of material from wafer 202. Furthermore, depending upon the relative height of chuck edge 210, and upon the relative turbidity of bath 230, solution 228 may be propelled up and over edge 210—carrying with it contaminants and debris cleaned from wafer 202.

In another embodiment of the present invention, the process and apparatus described in reference to FIG. 2 are modified slightly to render system 300, as described now in reference to FIG. 3. The constituent members and relationships of system 300 are substantially identical to those of system 200, with a few exceptions. In system 300, the distance 226 between barrier 220 and wafer 202 is increased, and the flow of gas 218 is decreased, just enough to induce a trickle flow 302 of solution 228. As solution 228 flows over wafer 202 and through bath 230, a small amount begins to flow over barrier 220 toward active area 206. This effect can be used to clean a greater portion of the front side of wafer 202. The material composition of barrier 220 can be selected such that it wicks flow 302 down, and out of chuck 208 through the aperture formed therein. The flow of gas 218 is, initially, reduced just enough to allow flow 302 to form. Once flow 302 is established, the flow of gas 218 can be slightly increased so as to further promote the wicking of flow 302 down barrier 220. Thus, the extent of remediation performed on the front side of wafer 202, up to and including active area 206, can be selectively controlled.

Depending upon the semiconductor materials and processes used, the composition of solution 228 may be varied greatly. A single solution for cleaning or stripping all materials may be provided and utilized. Alternatively, material selective solutions that clean or strip only particular layers may be employed individually or in combination, concurrently or serially.

In one embodiment of the present invention, for example, one solution may be provided of sufficient strength for cleaning or stripping away only metal layers, without dissolving dielectric layers. Assuming, for example, that metal layers on a given wafer comprise a commonly used semiconductor metal, such as copper or tantalum nitride, the metal cleaning solution may comprise a mixture of HF, nitric acid, acetic acid, and water. In one embodiment of the present invention, this metal cleaning mixture may comprise HF, nitric acid, acetic acid, and water in a [1:5:1:(1–5)] ratio. In other words, the relative concentration of water can be varied between 1 and 5 parts, depending upon the desired strength and behavior of the metal cleaning solution. In alternative embodiments, the concentration of acetic acid may also be varied, so as to selective adjust the viscosity of the cleaning solution. Depending upon the specific semiconductor metal to be cleaned or stripped, other compositions of the metal cleaning solution may be provided in accordance with the present invention. Thus, to provide remediation of only the metal layers along the edge of a wafer 202, such a metal cleaning solution would be provided as solution 228 in either system 200 or 300.

In another embodiment of the present invention, one solution may be provided for cleaning or stripping away dielectric layers. Depending upon the semiconductor dielectric materials present, one solution may be provided to selectively clean or strip dielectric only, without affecting surrounding metal layers. In most cases, however, cleaning or stripping dielectric material requires a relatively strong solution—one that will, ultimately, clean or strip both dielectric and metal. Generally, however, once dielectric is removed from a particular area, it is not practical or desirable to leave, intact, the unsupported metal surrounding that area. Thus, in most cases, remediation of dielectric material will require and result in remediation of corresponding metal material. Accordingly, assuming that dielectric layers on a given wafer comprise a commonly used semiconductor dielectric, such as OSG (organic silicon glass) or FSG (fluoride silicon glass) film, the dielectric cleaning solution may comprise a mixture of nitric acid, phosphoric acid, HF, and acetic acid. In one embodiment of the present invention, this dielectric cleaning mixture may comprise nitric acid, phosphoric acid, HF, and acetic acid in a [6:4:1:1] ratio. In alternative embodiments, the concentration of acetic acid may be varied, so as to selective adjust the viscosity of the cleaning solution. Again, depending upon the specific semiconductor dielectric to be cleaned or stripped, other compositions of the dielectric cleaning solution may be provided in accordance with the present invention.

If a dielectric-only solution is provided, then remediation of only the dielectric layers along the edge of a wafer 202 would be completed in accordance with the present invention. Such a solution may be provided as solution 228 in either system 200 or 300. Alternatively, if remediation of both metal and dielectric layers is desired or acceptable, several methods may be employed. In one embodiment of the present invention, a metal cleaning solution is first applied as solution 228 in either system 200 or 300. After metal remediation is completed, then a dielectric cleaning solution is applied as solution 228 in either system 200 or 300. In this embodiment, it may be desirable to clean or strip the metal layers more extensively than the dielectric layers. Thus, a metal cleaning solution is applied first, followed by a dielectric cleaning solution. In an alternative embodiment, metal cleaning solution may be applied first in system 200, followed by dielectric solution in system 300. In another alternative embodiment, metal cleaning solution may be applied first in system 300, followed by dielectric solution in system 200. In still another alternative embodiment, where uniform and concurrent remediation of metal and dielectric is desired, metal and dielectric solutions may be combined, or a strong dielectric solution may be provided, as solution 228 in either system 200 or 300.

Thus, the systems of the present invention can be easily integrated into existing fabrication equipment and process flows. The apparatus and materials of the present invention are highly compatible with existing semiconductor production processes. The present invention therefore provides significant production yield benefits without requiring costly equipment or process modifications.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A system for remediating aberrations along a perimeter of a substrate, the system comprising:
   a cleaning apparatus adapted to spin the substrate within a confined area;
   a chuck, defining the confined area, having a sidewall extending above an upper surface of the substrate and surrounding the perimeter of the substrate in a spaced apart relationship, also having a bottom wall, with an aperture formed therein, beneath a lower surface of the substrate;
   an isolation barrier, disposed atop the bottom wall of the chuck, around the aperture, and in proximal relationship to the lower surface of the substrate, such that a narrow gap is formed between an upper surface of the barrier and the lower surface of the substrate;
   a pressurized source adapted to forcefully direct a gas at and along the lower surface of the substrate; and
   a remediation solution applied to the upper surface of the substrate, wherein the solution is forced into a well formed between an inner surface of the chuck sidewall and the perimeter of the substrate such that the solution bathes the perimeter of the substrate.

2. The system of claim 1, wherein the remediation solution is adapted to remediate only metal.

3. The system of claim 2, wherein the solution comprises HF, nitric acid, acetic acid, and water.

4. The system of claim 3, wherein the solution comprises HF, nitric acid, and acetic acid in a [1:5:1] ratio.

5. The system of claim 3, wherein viscosity of the solution is altered by varying the concentration of acetic acid.

6. The system of claim 4, wherein the concentration of water is varied between 1 and 5 parts.

7. The system of claim 1, wherein the remediation solution is adapted to remediate only dielectric.

8. The system of claim 1, wherein the remediation solution is adapted to remediate metal and dielectric.

9. The system of claim 8, wherein the solution comprises nitric acid, phosphoric acid, HF, and acetic acid.

10. The system of claim 8, wherein the solution comprises nitric acid, phosphoric acid, HF, and acetic acid in a [6:4:1:1] ratio.

11. The system of claim 8, wherein viscosity of the solution is altered by varying the concentration of acetic acid.

12. The system of claim 1, wherein the isolation barrier comprises a polymer O-ring.

13. The system of claim 1, wherein the isolation barrier comprises a ceramic flange.

14. The system of claim 1, wherein the narrow gap is formed of a dimension, and the gas is directed along the lower surface of the substrate with sufficient force, such that only the gas passes through the gap and into the well.

15. The system of claim 1, wherein the narrow gap is formed of sufficient dimension, and the gas is directed along the lower surface of the substrate with sufficient force, such that a small flow of solution is induced from the well and directed down around the barrier and through the aperture.

16. The system of claim 15, wherein the small flow of solution is directed down around the barrier by the gas.

17. A wafer edge remediation assembly comprising:
   a cleaning apparatus adapted to spin a wafer within a confined area;
   a chuck, defining the confined area, having a sidewall adapted to extend above an upper surface of a wafer and surround the perimeter of a wafer in a spaced apart relationship, also having a bottom wall with an aperture formed therein;
   an isolation barrier, disposed atop the bottom wall of the chuck, around the aperture, adapted to be disposed in proximal relationship to a lower surface of a wafer;
   a pressurized source adapted to forcefully direct a gas, through the aperture, at and along a lower surface of a wafer; and
   a remediation solution source.

18. The system of claim 17, wherein the remediation solution source provides a solution adapted to remediate only metal.

19. The system of claim 18, wherein the solution comprises HF, nitric acid, acetic acid, and water.

20. The system of claim 19, wherein the solution comprises HF, nitric acid, and acetic acid in a [1:5:1] ratio.

21. The system of claim 19, wherein viscosity of the solution is altered by varying the concentration of acetic acid.

22. The system of claim 20, wherein the concentration of water is varied between 1 and 5 parts.

23. The system of claim 17, wherein the remediation solution source provides a solution adapted to remediate metal and dielectric.

24. The system of claim 23, wherein the solution comprises nitric acid, phosphoric acid, HF, and acetic acid.

25. The system of claim 24, wherein the solution comprises nitric acid, phosphoric acid, HF, and acetic acid in a [6:4:1:1] ratio.

26. The system of claim 23, wherein viscosity of the solution is altered by varying the concentration of acetic acid.

27. The system of claim 17, wherein the isolation barrier comprises a polymer O-ring.

28. A method of remediating aberrations along a perimeter of a wafer, comprising the steps of:
   providing a wafer having aberrations along its outer perimeter;
   providing a cleaning apparatus adapted to spin the wafer within a confined area;
   providing a chuck, defining the confined area, having a sidewall extending above an upper surface of the wafer and surrounding the perimeter of the wafer in a spaced apart relationship, forming a circumferential well therebetween, and also having a bottom wall, with an aperture formed therein, beneath a lower surface of the wafer;
   providing an isolation barrier, disposed atop the bottom wall of the chuck, around the aperture, and in proximal relationship to the lower surface of the wafer, forming a narrow gap between an upper surface of the barrier and the lower surface of the wafer;
   providing a pressurized source adapted to forcefully direct a gas at and along the lower surface of the wafer;
   providing a remediation solution;
   applying the remediation solution to the upper surface of the wafer, wherein the solution is forced into the circumferential well such that the solution bathes the outer perimeter of the wafer.

29. The system of claim 28, wherein the narrow gap is formed of sufficient dimension, and the gas is directed along the lower surface of the substrate with sufficient force, such that a small flow of remediation solution is induced from the circumferential well and directed down around the barrier and through the aperture.

* * * * *